US010560065B2

(12) United States Patent
Kishimoto

(10) Patent No.: US 10,560,065 B2
(45) Date of Patent: Feb. 11, 2020

(54) PIEZOELECTRIC RESONATOR MANUFACTURING METHOD AND PIEZOELECTRIC RESONATOR

(71) Applicant: Murata Manufacturing Co., Ltd., Nagaokakyo-shi, Kyoto-fu (JP)

(72) Inventor: Yutaka Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 443 days.

(21) Appl. No.: 15/396,840

(22) Filed: Jan. 3, 2017

(65) Prior Publication Data
US 2017/0149405 A1 May 25, 2017

Related U.S. Application Data

(63) Continuation of application No. PCT/JP2015/067410, filed on Jun. 17, 2015.

(30) Foreign Application Priority Data

Aug. 5, 2014 (JP) .................................. 2014-159387

(51) Int. Cl.
*H03H 3/02* (2006.01)
*H03H 9/17* (2006.01)
(Continued)

(52) U.S. Cl.
CPC ................ *H03H 3/02* (2013.01); *H03H 3/08* (2013.01); *H03H 9/02228* (2013.01);
(Continued)

(58) Field of Classification Search
CPC ........ H03H 3/02; H03H 3/08; H03H 9/02228; H03H 9/173; H03H 9/25; H03H 2003/021
See application file for complete search history.

(56) References Cited

U.S. PATENT DOCUMENTS

2003/0112986 A1* 6/2003 Furukawa ................ H03H 3/08
381/190
2005/0077803 A1* 4/2005 Ha .......................... H03H 3/02
310/324
(Continued)

FOREIGN PATENT DOCUMENTS

JP 07-245382 A 9/1995
JP 2008-131356 A 6/2008
(Continued)

OTHER PUBLICATIONS

Official Communication issued in corresponding International Application PCT/JP2015/067410, dated Aug. 4, 2015.
(Continued)

*Primary Examiner* — Bryan P Gordon
(74) *Attorney, Agent, or Firm* — Keating & Bennett, LLP

(57) ABSTRACT

In a piezoelectric resonator manufacturing method, a sacrificial layer is formed on a back surface of a piezoelectric substrate. A support layer is formed on the back surface of the piezoelectric substrate so as to cover the sacrificial layer. A support layer as a piezoelectric resonator is formed by flattening the support layer. A recess in which the surface of the sacrificial layer is recessed with respect to the surface of the support layer is formed by abrading the surfaces of the support layer and the sacrificial layer. The recess extends to a vicinity of a boundary surface between the support layer and the sacrificial layer in the support layer. A support substrate is adhered to the surfaces of the support layer including the recess and the sacrificial layer via an adhesive material.

4 Claims, 4 Drawing Sheets

(51) Int. Cl.
*H03H 3/08* (2006.01)
*H03H 9/02* (2006.01)
*H03H 9/25* (2006.01)

(52) U.S. Cl.
CPC .............. *H03H 9/173* (2013.01); *H03H 9/25* (2013.01); *H03H 2003/021* (2013.01)

(56) References Cited

U.S. PATENT DOCUMENTS

| | | | |
|---|---|---|---|
| 2006/0033595 A1* | 2/2006 | Nagao | H01L 41/316 333/189 |
| 2007/0188047 A1* | 8/2007 | Tanaka | H03H 9/02228 310/313 D |
| 2012/0073099 A1 | 3/2012 | Iwamoto et al. | |
| 2012/0205754 A1* | 8/2012 | Iwamoto | H03H 3/02 257/415 |
| 2013/0234805 A1 | 9/2013 | Takahashi | |

FOREIGN PATENT DOCUMENTS

| | | |
|---|---|---|
| JP | 2013-214954 A | 10/2013 |
| WO | 2010/143475 A1 | 12/2010 |
| WO | 2011/052551 A1 | 5/2011 |

OTHER PUBLICATIONS

Official Communication issued in corresponding Japanese Patent Application No. 2016-539889, dated Feb. 27, 2018.

\* cited by examiner

PIEZOELECTRIC RESONATOR MANUFACTURING METHOD AND PIEZOELECTRIC RESONATOR

CROSS REFERENCE TO RELATED APPLICATIONS

This application claims the benefit of priority to Japanese Patent Application No. 2014-159387 filed on Aug. 5, 2014 and is a Continuation Application of PCT Application No. PCT/JP2015/067410 filed on Jun. 17, 2015. The entire contents of each application are hereby incorporated herein by reference.

BACKGROUND OF THE INVENTION

1. Field of the Invention

The present invention relates to a method for manufacturing a piezoelectric resonator including a membrane structure, and the piezoelectric resonator.

2. Description of the Related Art

Various existing piezoelectric resonators (piezoelectric devices) have been devised. For example, International Publication No. 2011/052551 discloses a piezoelectric resonator (piezoelectric device) having a membrane structure.

In the existing piezoelectric resonator having the membrane structure as disclosed in International Publication No. 2011/052551, a support substrate is arranged at the back surface side of a piezoelectric thin film. The piezoelectric thin film is fixed to the support substrate with a support layer. A space with which the support layer does not abut against the back surface of the piezoelectric thin film is provided between the piezoelectric thin film and the support substrate at the back surface side of the piezoelectric thin film.

The space in the piezoelectric resonator having the above-described membrane structure is provided by forming a sacrificial layer and the support layer between the back surface of the piezoelectric thin film and the support substrate and selectively removing the sacrificial layer.

The sacrificial layer is removed by making a hole for removing the sacrificial layer in the piezoelectric thin film and allowing a solvent for removal to enter from the hole.

However, with the existing configuration and manufacturing method of the piezoelectric resonator, it is not easy to remove substantially all of the sacrificial layer in a short period of time. Even if the sacrificial layer remains without being removed, desired characteristics of the piezoelectric resonator are not obtained.

SUMMARY OF THE INVENTION

Accordingly, preferred embodiments of the present invention provide a piezoelectric resonator manufacturing method capable of removing substantially all of a sacrificial layer in a short period of time and a piezoelectric resonator.

A piezoelectric resonator manufacturing method according to a preferred embodiment of the present invention includes forming a sacrificial layer on a back surface of a piezoelectric substrate, forming a support layer on the back surface of the piezoelectric substrate, forming a recess in which the sacrificial layer is recessed with respect to the support layer by removing a portion the support layer and a portion of the sacrificial layer, causing a support substrate to adhere to a surface of the support layer at a side at which the recess is formed, and removing the sacrificial layer.

In a manufacturing method according to a preferred embodiment of the present invention, the support layer and the support substrate are caused to adhere to each other with an adhesive material with a step at a boundary between the support layer and the support substrate in a state in which the sacrificial layer and a portion of the support layer in the vicinity of the sacrificial layer are spaced from the support substrate relative to other portions of the support layer. Therefore, a close contact force between the sacrificial layer and the support substrate is significantly decreased. With this, the sacrificial layer is easily removed.

Furthermore, in a piezoelectric resonator manufacturing method according to a preferred embodiment of the present invention, it is preferable that the recess be formed by abrading the support layer and the sacrificial layer, for example.

Moreover, in a piezoelectric resonator manufacturing method according to a preferred embodiment of the present invention, it is preferable that the recess be formed by etching the support layer and the sacrificial layer, for example.

In the above-described manufacturing methods, specific example methods for forming the recess are indicated. Using any of these example methods enables the recess to be formed with high accuracy.

A piezoelectric resonator according to another preferred embodiment of the present invention includes a piezoelectric thin film, a support substrate located at a back surface side of the piezoelectric thin film, and a support layer that fixes the piezoelectric thin film to the support substrate to define a space between the piezoelectric thin film and the support substrate. A corner portion of the support layer at the support substrate side, which is exposed to the space, includes a recess defined by a cut in the corner portion.

With this configuration, the sacrificial layer is easily removed in a process of manufacturing the piezoelectric resonator, thus reliably providing a piezoelectric resonator having desired characteristics.

A piezoelectric resonator according to still another preferred embodiment of the present invention includes a piezoelectric thin film, a support substrate located at a back surface side of the piezoelectric thin film, and a support layer that fixes the piezoelectric thin film to the support substrate so as to provide a space between the piezoelectric thin film and the support substrate. The support surface includes a recess in a region exposed to the space.

Also with this configuration, the piezoelectric resonator with desired characteristics is able to be provided reliably.

According to various preferred embodiments of the present invention, substantially all of a sacrificial layer is able to be removed quickly and easily. With this, piezoelectric resonators having desired characteristics are able to be manufactured reliably.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
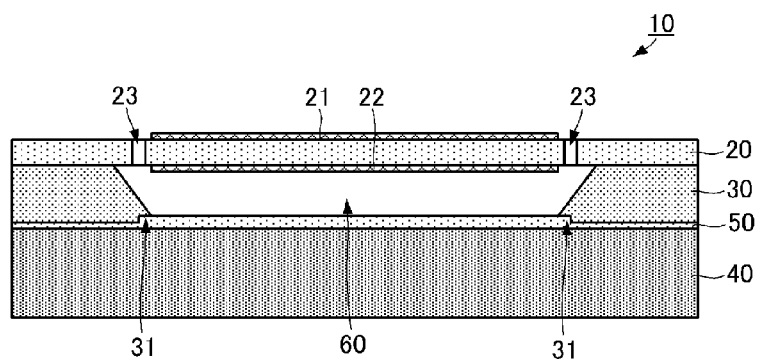
FIG. 1 is a cross-sectional view illustrating the main configuration of a piezoelectric resonator according to a first preferred embodiment of the present invention.

A piezoelectric resonator and a method for manufacturing the piezoelectric resonator according to a first preferred embodiment of the present invention will be described with reference to the drawings. FIG. 1 is a cross-sectional view illustrating the main configuration of the piezoelectric resonator according to the present preferred embodiment of the present invention.

A piezoelectric resonator 10 includes a piezoelectric thin film 20, a support layer 30, and a support substrate 40.

A material of the piezoelectric thin film 20 preferably is a piezoelectric body such as $LiTaO_3$, $LiNbO_3$ or the like. A front surface electrode 21 is provided on a front surface of the piezoelectric thin film 20. A back surface electrode 22 is provided on a back surface of the piezoelectric thin film 20. The front surface electrode 21 and the back surface electrode 22 preferably are Al electrodes using, for example, Ti as an underlying metal. When the piezoelectric resonator 10 is a surface acoustic wave (SAW) resonator or a plate wave resonator, the front surface electrode 21 is a comb electrode and a reflector electrode, and the back surface electrode 22 is not present or is a ground electrode. When the piezoelectric resonator 10 is a bulk acoustic wave (BAW) resonator, both of the front surface electrode 21 and the back surface electrode 22 are driving electrodes (terminal electrodes).

The support layer 30 is preferably made of an insulating material such as $SiO_2$. The support layer 30 partially abuts against the back surface of the piezoelectric thin film 20. To be specific, the support layer 30 abuts against the piezoelectric thin film 20 in a portion excluding a region of the piezoelectric thin film 20 in which a portion generating piezoelectric resonation is present.

The support substrate 40 is made of an insulating material having predetermined hardness. The support substrate 40 abuts against an end surface of the support layer 30 at the opposite side to an end surface abutting against the piezoelectric thin film 20. The support substrate 40 adheres to the support layer 30 with an adhesive material 50.

With this configuration, a space 60 is provided in a region in which the support layer 30 is not located between the back surface of the piezoelectric thin film 20 and the support substrate 40. As a result of the space 60 being provided, piezoelectric vibration of the piezoelectric thin film 20 is not inhibited. Accordingly, the piezoelectric resonator 10 that achieves preferable confinement efficiency of elastic waves and has excellent transmission characteristics is provided.

Furthermore, in the present preferred embodiment, a recess 31 is provided at a corner portion of the support layer 30, which is exposed to the space 60, at the side adhering to the support substrate 40. A surface of the recess 31, which is parallel or substantially parallel to an electrode formation surface of the piezoelectric thin film 20, is spaced from the surface of the support substrate 40 relative to the surface of the support layer 30 other than the recess 31, which adheres to the support substrate 40. Providing the recess 31 enables a sacrificial layer (for example, a sacrificial layer 600 in FIG. 3 and FIG. 4) to define the space 60 to be easy to be separated from the support substrate 40 when the piezoelectric resonator 10 is manufactured. Accordingly, the sacrificial layer is able to be removed in a short period of time. Furthermore, the piezoelectric resonator 10 having desired characteristics is easily provided because the sacrificial layer is able to be removed reliably.

Figure 2:
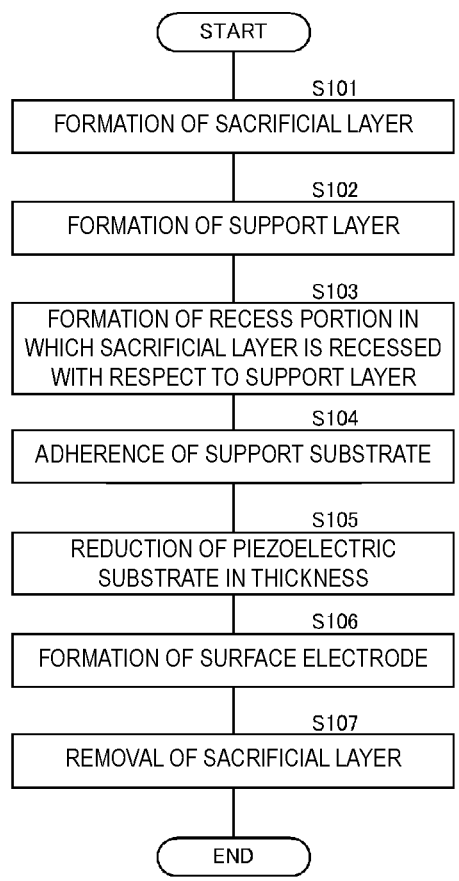
FIG. 2 is a flowchart illustrating a method for manufacturing a piezoelectric resonator according to the first preferred embodiment of the present invention.

Next, a more specific method for manufacturing the piezoelectric resonator according to the first preferred embodiment of the present invention will be described. FIG. 2 is a flowchart illustrating the method for manufacturing the piezoelectric resonator according to the first preferred embodiment of the present invention. FIG. 3 and FIG. 4 are cross-sectional views illustrating the configuration of the piezoelectric resonator in each of the manufacturing processes according to the first preferred embodiment of the present invention.

First, a piezoelectric substrate 200 is prepared. A material of the piezoelectric substrate 200 preferably is a piezoelectric body such as $LiTaO_3$, $LiNbO_3$ or the like. The back surface electrode 22 is formed on the back surface of the piezoelectric substrate 200. The back surface electrode 22 is formed by deposition of Ti and Al on the back surface of the piezoelectric substrate 200 in order by, for example, a deposition lift-off method or the like. This configuration may be omitted when a piezoelectric resonator requiring no back surface electrode is configured.

Figure 3A:
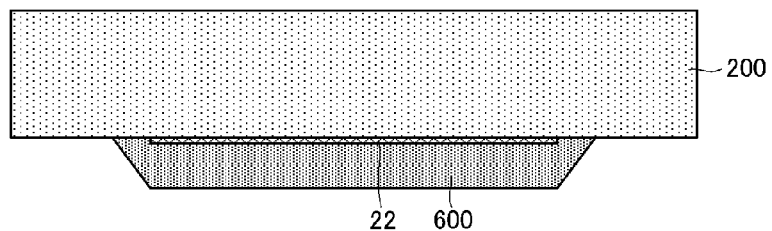
FIGS. 3A-3D are cross-sectional views illustrating the configuration of the piezoelectric resonator in each of manufacturing processes according to the first preferred embodiment of the present invention.

At step S101, the sacrificial layer 600 is formed on the back surface of the piezoelectric substrate 200 so as to cover the back surface electrode 22 (see FIG. 3A). The sacrificial layer 600 is made of, for example, ZnO. The sacrificial layer 600 is formed by forming a ZnO layer on the overall back surface of the piezoelectric substrate 200 by a sputtering method, and then, patterning the ZnO layer by wet etching or the like. For example, the film thickness of the sacrificial layer 600 preferably is about 1 μm to about 3 μm.

Figure 3B:
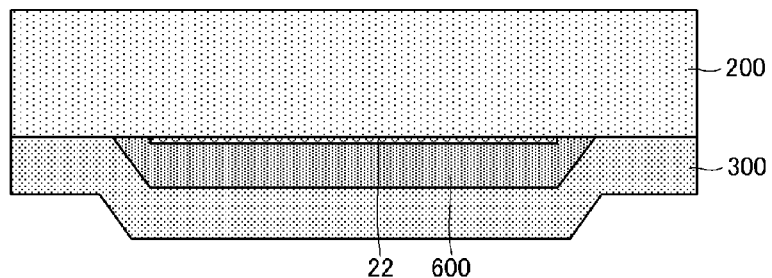

At step S102, a support layer 300 is formed on the back surface of the piezoelectric substrate 200 so as to cover the sacrificial layer 600 (see FIG. 3B). The support layer 300 is made of, for example, $SiO_2$. The support layer 300 is formed on the overall back surface of the piezoelectric substrate 200 on which the sacrificial layer 600 has been pattern-formed by the sputtering method. For example, the film thickness of the support layer 300 preferably is about 2 μm to about 8 μm. The support layer 30 is formed by flattening the surface of the support layer 300 by abrasion or the like. That is to say, the support layer 30 remaining in the piezoelectric resonator 10 is formed by eliminating by abrasion a rising portion corresponding to a region of the support layer 300, which covers the sacrificial layer 600.

Figure 3C:
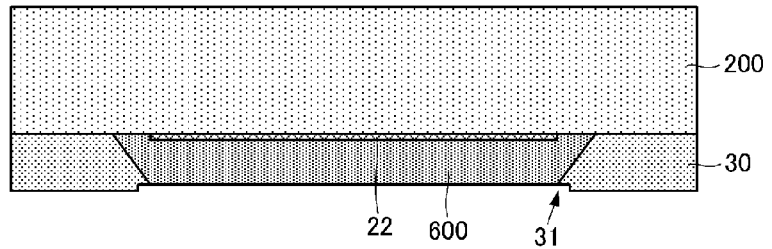

At step S103, the recess 31 in which the sacrificial layer 600 is recessed relative to the support layer 30 is formed in the flattened support layer 30 and sacrificial layer 600 (see FIG. 3C). To be specific, the surfaces of the support layer 30 and the sacrificial layer 600 are abraded or grinded. In this case, abrasion rates of the support layer 30 and the sacrificial layer 600 are different because the materials thereof are different, and the abrasion rate of the sacrificial layer 600 is higher than the abrasion rate of the support layer 30. Accordingly, a larger portion of the sacrificial layer 600 is abraded or grinded than the support layer 30 even for the same abrasion time. Using this difference in the abrasion rate, the recess 31 in which the region of the sacrificial layer 600 is recessed relative to the region of the support layer 30 is formed. It should be noted that a portion of the support layer 30 in the vicinity of the boundary surface between the support layer 30 and the sacrificial layer 600 is also easier to be abraded or grinded than other portions of the support layer 30. Therefore, as illustrated in FIG. 3C, the recess 31 has a structure not only including the region of the sacrificial layer 600 but also extending to the region of the support layer 30 in the vicinity of the boundary surface between the support layer 30 and the sacrificial layer 600 by a predetermined width.

Figure 3D:
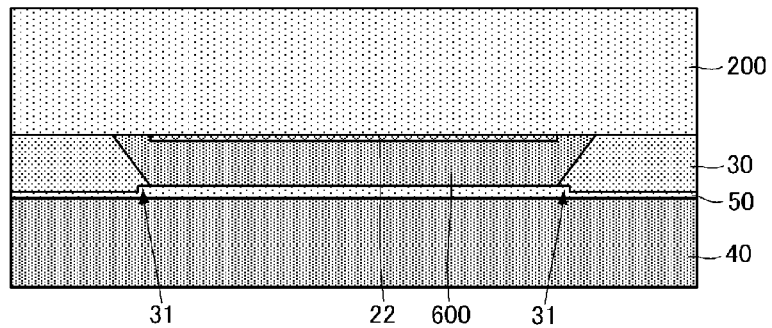

At step S104, the support substrate 40 is made to adhere to the surfaces of the support layer 30 and the sacrificial layer 600 in which the recess 31 has been formed using the adhesive material 50 (see FIG. 3D). In this case, distances of the surface of the sacrificial layer 600 and the bottom surface of the recess from the support substrate 40 are larger than that of the surface of the support layer 30 other than the recess 31 from the support substrate 40. Accordingly, close contact performance between the sacrificial layer 600 and the recess 31 and the support substrate 40 is lower than that between the support layer 30 other than the recess 31 and the support substrate 40.

Figure 4A:
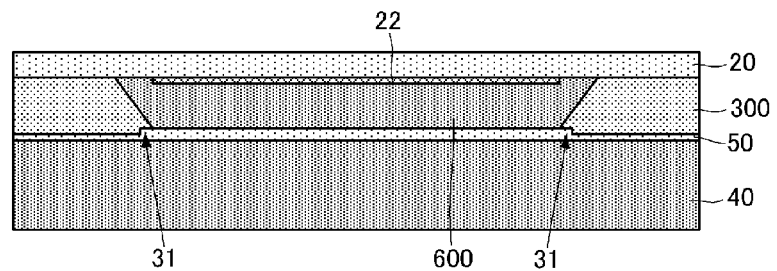
FIGS. 4A-4D are cross-sectional views illustrating the configuration of the piezoelectric resonator in each of manufacturing processes according to the first preferred embodiment of the present invention.

At step S105, the piezoelectric thin film 20 is formed by reducing the piezoelectric substrate 200 in thickness (see FIG. 4A). It is sufficient that the piezoelectric substrate 200 is reduced in thickness by a known method. For example, the piezoelectric substrate 200 is reduced in thickness by abrading it from the opposite side to the surface of the piezoelectric substrate 200 on which the sacrificial layer 600 has been formed. Alternatively, before the sacrificial layer 600 is formed, hydrogen ions may be injected from the back surface side of the piezoelectric substrate 200 to form a cleavage layer at a predetermined depth position from the back surface. Then, the cleavage is made to extend by heating the cleavage layer after adhesion of the support substrate 40. With this, a portion having a predetermined thickness at the back surface side of the piezoelectric substrate 200 is isolated from the piezoelectric substrate 200 to form the piezoelectric thin film 20.

Figure 4B:
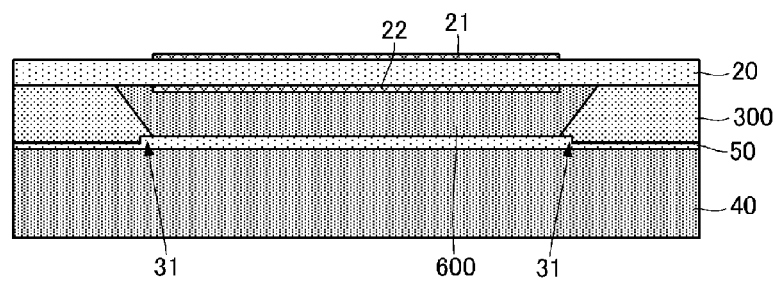
Figure 4C:
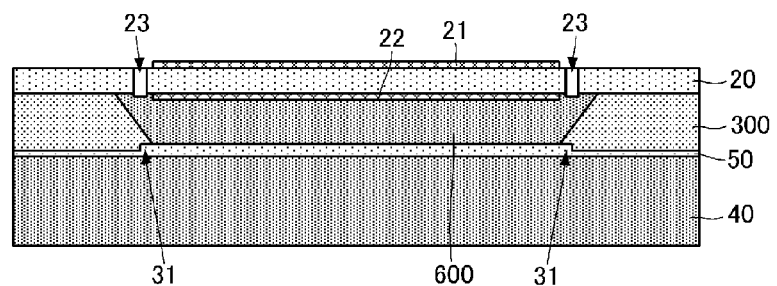
Figure 4D:
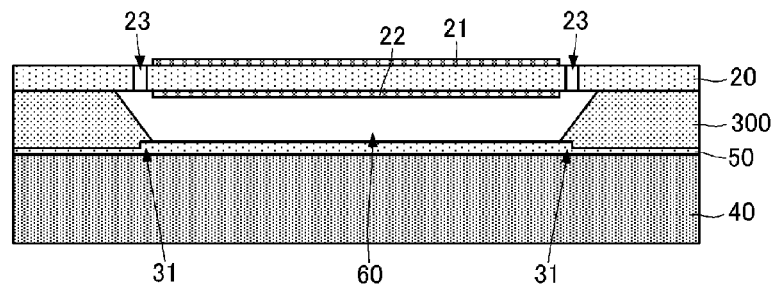

At step S106, the surface electrode 21 is formed on the surface of the piezoelectric thin film 20 (surface of the piezoelectric thin film 20 at the opposite side to the surface on which the sacrificial layer 600 has been formed) (see FIG. 4B). The surface electrode 21 is formed by deposition of Ti and Al on the surface of the piezoelectric thin film 20 in order by, for example, the deposition lift-off method or the like. The film thickness of the surface electrode 21 preferably is, for example, about 10 nm to about 2000 nm.

At step S107, the sacrificial layer 600 is removed and the space 60 is formed between the piezoelectric thin film 20 and the support substrate 40. To be more specific, a hole 23 for removing the sacrificial layer 600 is provided in the piezoelectric thin film 20 (see FIG. 4C). The opening surface of the hole 23 is smaller than the area of the sacrificial layer 600. The hole 23 is formed by, for example, a dry etching method. An etching solution is injected from the hole 23 to remove the sacrificial layer 600 (see FIG. 4D). As the etching solution, a mixed solution of acetic phosphoric acid is used. The mixed solution of acetic phosphoric acid is a solution obtained by mixing acetic acid, phosphoric acid, and water at 1:1:10.

With the configuration in the present preferred embodiment, the close contact strength between the sacrificial layer 600 and the support substrate 40 is lower than the close contact strength between the support layer 30 and the support substrate 40 as described above. Accordingly, the sacrificial layer 600 is able to be removed reliably in a short period of time in comparison with the existing configuration and the existing manufacturing method.

Figure 5:
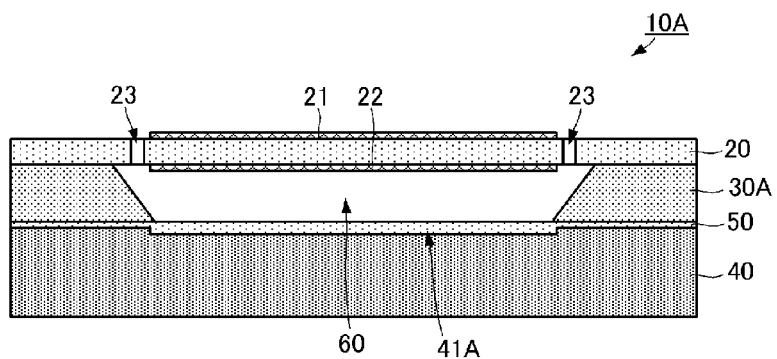
FIG. 5 is a cross-sectional view illustrating a main configuration of a piezoelectric resonator according to a second preferred embodiment of the present invention.

Next, a piezoelectric resonator and a method for manufacturing the piezoelectric resonator according to a second preferred embodiment of the present invention will be described with reference to the drawings. FIG. 5 is a cross-sectional view illustrating the main configuration of the piezoelectric resonator according to the second preferred embodiment of the present invention.

A piezoelectric resonator 10A according to the second preferred embodiment of the present invention is different from the piezoelectric resonator 10 according to the first preferred embodiment of the present invention in a formation place of a recess and other configurations thereof are the same as those of the piezoelectric resonator 10 according to the first preferred embodiment of the present invention.

As illustrated in FIG. 5, in the piezoelectric resonator 10A, a recess 41A is provided in the support substrate 40. The recess 41A includes a region in which at least the support substrate 40 is exposed to the space 60 with the adhesive layer 50 interposed therebetween.

Even with this configuration, the same advantageous effects as those obtained by the piezoelectric resonator 10 according to the first preferred embodiment are able to be obtained. Furthermore, in this configuration, no recess is formed in a support layer 30A. Accordingly, a volume of the space 60, which is defined by the support layer 30A, is able to be determined with higher accuracy, thus manufacturing the piezoelectric resonator 10A having desired characteristics with high accuracy.

Figure 6:
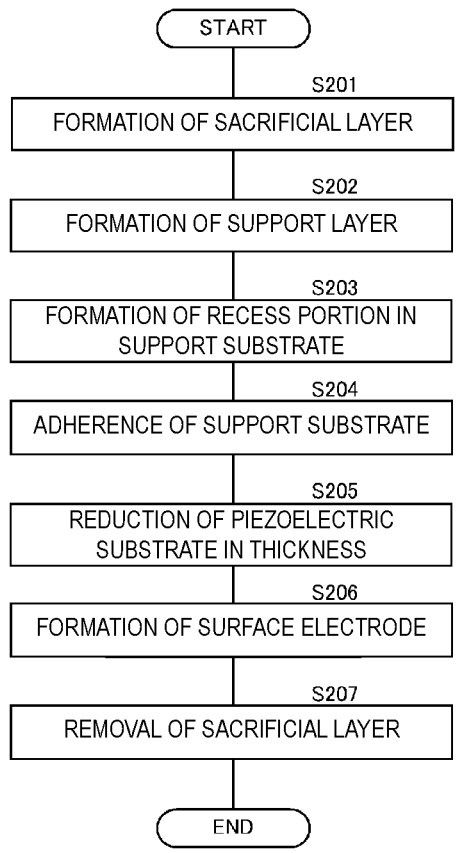
FIG. 6 is a flowchart illustrating a method for manufacturing the piezoelectric resonator according to the second preferred embodiment of the present invention.

The piezoelectric resonator 10A according to the present preferred embodiment preferably is manufactured by the following processes. FIG. 6 is a flowchart illustrating the method for manufacturing the piezoelectric resonator according to the second preferred embodiment of the present invention.

The method for manufacturing the piezoelectric resonator 10A according to the present preferred embodiment is basically the same as the method for manufacturing the piezoelectric resonator 10 according to the first preferred embodiment other than formation of the recess.

At step S201, a sacrificial layer is formed on the back surface of a piezoelectric substrate so as to cover a back surface electrode.

At step S202, a support layer is formed on the back surface of the piezoelectric substrate so as to cover the sacrificial layer. Then, the surfaces (abrasion surfaces) of the support layer and the sacrificial layer are flattened by abrading them until the sacrificial layer is exposed from the surface at the opposite side to the piezoelectric substrate.

At step S203, the recess 41A is formed by partially abrading the surface of the support substrate 40.

At step S204, the support substrate 40 on which the recess 41A has been formed is made to adhere to the support layer and the sacrificial layer using the adhesive material 50.

At step S205, a piezoelectric thin film is formed by reducing the piezoelectric substrate in thickness.

At step S206, a surface electrode is formed on the surface of the piezoelectric thin film (surface of the piezoelectric thin film at the opposite side to the surface on which the sacrificial layer has been formed).

At step S207, the sacrificial layer is removed and the space 60 is formed between the piezoelectric thin film 20 and the support substrate 40.

In the above-described configuration, the recess 31 or 41A preferably is formed by abrasion, for example. Alternatively, the recess 31 may be formed by etching using difference in an etching rate between a material of the support layer and a material of the sacrificial layer, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric resonator comprising:
    a piezoelectric thin film;
    a support substrate located at a back surface side of the piezoelectric thin film;
    an adhesive layer located at a surface side of the support substrate that faces the back surface side of the piezoelectric thin film; and
    a support layer that fixes the piezoelectric thin film to the support substrate so as to provide a space between the piezoelectric thin film and the support substrate; wherein
    a corner portion of the support layer at a side of the support substrate, which is exposed to the space, includes a recess defined by a cut in the corner portion;
    the support substrate includes an adhered portion at which the support layer and the support substrate are adhered to one another, and a non-adhered portion at which the support layer and the support substrate are not adhered to one another; and
    a thickness of a portion of the adhesive layer located at the adhered portion is thinner than a thickness of another portion of the adhesive layer located at the non-adhered portion.

2. The piezoelectric resonator according to claim 1, wherein the piezoelectric resonator is one of a surface acoustic wave resonator, a plate wave resonator and a bulk acoustic wave resonator.

3. A piezoelectric resonator comprising:
    a piezoelectric thin film;
    a support substrate located at a back surface side of the piezoelectric thin film;
    an adhesive layer located at a surface side of the support substrate that faces the back surface side of the piezoelectric thin film; and
    a support layer that fixes the piezoelectric thin film to the support substrate so as to provide a space between the piezoelectric thin film and the support substrate; wherein
    the support substrate includes a recess in a region exposed to the space;
    the support substrate includes an adhered portion at which the support layer and the support substrate are adhered to one another, and a non-adhered portion at which the support layer and the support substrate are not adhered to one another; and
    a thickness of a portion of the adhesive layer located at the adhered portion is thinner than a thickness of another portion of the adhesive layer located at the non-adhered portion.

4. The piezoelectric resonator according to claim 3, wherein the piezoelectric resonator is one of a surface acoustic wave resonator, a plate wave resonator and a bulk acoustic wave resonator.

* * * * *